United States Patent
Fork et al.

(10) Patent No.: US 7,141,734 B1
(45) Date of Patent: Nov. 28, 2006

(54) ALTERNATING CURRENT SOLAR POWER APPARATUS

(75) Inventors: David K. Fork, Los Altos, CA (US); Koenraad F. Van Schuylenbergh, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/313,902

(22) Filed: Dec. 20, 2005

(51) Int. Cl.
*H01L 31/42* (2006.01)
*H01L 31/05* (2006.01)

(52) U.S. Cl. ...................... 136/243; 136/244
(58) Field of Classification Search ............... 136/243, 136/244, 246, 249, 254; 323/906
See application file for complete search history.

(56) References Cited

U.S. PATENT DOCUMENTS

| | | | | |
|---|---|---|---|---|
| 4,058,729 A | * | 11/1977 | Sher | .................. 250/370.01 |
| 4,074,129 A | * | 2/1978 | O'Hare | ................. 250/214 SG |
| 4,075,034 A | * | 2/1978 | Butler | .......................... 136/246 |
| 4,152,597 A | * | 5/1979 | Sher | ...................... 250/370.01 |
| 4,533,783 A | * | 8/1985 | Benjamin et al. | ............ 136/249 |
| 4,577,052 A | * | 3/1986 | Schutten et al. | ............. 136/246 |
| 4,728,878 A | * | 3/1988 | Anthony | ...................... 322/2 R |
| 6,686,533 B1 | * | 2/2004 | Baum et al. | ................. 136/244 |

* cited by examiner

*Primary Examiner*—Bao Q. Vu
(74) *Attorney, Agent, or Firm*—Bever, Hoffman & Harms, LLP; Patrick T. Bever

(57) ABSTRACT

An alternating current (AC) solar power apparatus includes a photovoltaic cell and a circuit or device for causing a signal generated by the photovoltaic cell to oscillate in a negative differential resistance range, thereby producing an AC output voltage. The photovoltaic cell exhibits negative differential resistance in its current/voltage (IV) curve in the presence of high flux illumination, wherein when the output voltage is within a negative differential resistance range, an incremental increase in the output voltage produces an associated decrease in generated current. By connecting the terminals of the photovoltaic cell to a resonator (e.g., an inductive-capacitive circuit) or other device that produces oscillation within the negative differential resistance range, the photovoltaic cell is caused to produce AC power.

8 Claims, 3 Drawing Sheets

ALTERNATING CURRENT SOLAR POWER APPARATUS

FIELD OF THE INVENTION

This invention relates to the conversion of light irradiation to electrical energy, more particularly, to solar cells that convert solar energy to alternating current (AC) electrical energy.

BACKGROUND OF THE INVENTION

Solar cells are typically photovoltaic (PV) devices that convert sunlight directly into electricity. PV cells typically include a semiconductor (e.g., silicon) that absorbs light irradiation (e.g., sunlight) in a way that creates free electrons, which in turn are caused to flow in the presence of a built-in field to create direct current (DC) power. The DC power generated by several PV cells may be collected on a grid placed on the cell. Current from multiple PV cells is then combined by series and parallel combinations into higher currents and voltages. The DC power thus collected may then be sent over wires, often many dozens or even hundreds of wires.

The DC power generated by solar cells is suitable for small-scale DC systems, such as solar powered calculators or remote sensors, but presents several problems when utilized on a larger scale, such as in homes and businesses.

A first problem associated with the large-scale use of solar power is that the DC power must first be converted using an expensive power inverter into a suitable alternating current (AC) signal before it can be used to power common household appliances, or transformed to high voltage for transmission over the power grid. Over a century ago, Nicola Tesla and Thomas Edison battled each other on the merits of AC versus DC for power transmission. Edison fought stubbornly and lost. AC power became recognized as the superior form of electricity for power distribution for several important reasons, including cost, reliability, and efficiency. As a result, household appliances that utilize distributed power (i.e., by way of a plug that is inserted into a wall socket) are configured to run on AC power. Because solar cells generate DC power, this DC power must first be converted into the AC power required to run the appliances. Currently, this DC-to-AC power conversion requires the use of a power converter, which is an expensive device that makes up a significant portion of the total cost of generating AC power using solar energy.

The high DC-to-AC conversion expense may be avoided by utilizing solar cells in large DC systems, but this approach generates several expensive obstacles as well. First, large scale DC power use causes corrosion or electro-migration under some conditions that stems from the high DC currents, and current capacity limitations are imposed by these DC currents that increase system cost. Even if these technical problems can be solved, the conversion to DC power would require the wholesale replacement of conventional AC appliances with a new line of DC powered appliances. Due to these issues, although there have been pilot projects to wire buildings with separate DC power systems to specifically accommodate solar installations, it is unlikely that there will be broad adoption of this approach as long as solar cells generate DC power.

What is needed is a solar power apparatus that generates AC power without the need for power inverters.

SUMMARY OF THE INVENTION

The present invention is directed to an alternating current solar power apparatus including a photovoltaic cell and a circuit or device for causing a signal generated by the photovoltaic cell to oscillate in a negative differential resistance range, thereby producing an AC output voltage and/or electromagnetic radiation. The present invention takes advantage of a recently discovered effect in which the output of at least some photovoltaic cells to exhibit negative differential resistance in its I-V curve in a certain range of high flux illumination. In accordance with this effect, a photovoltaic cell generates an output current that is directly proportional to an amount of applied light irradiation at low flux illuminations, but exhibits a range of negative differential resistance at elevated light levels, where an incremental increase in the output voltage produces an associated decrease in generated current. By connecting the terminals of the photovoltaic cell to an LC resonator or other device that produces oscillation within the negative differential resistance range, the photovoltaic cell is caused to produce AC power without the need for an expensive power converter.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to an alternating current solar power apparatus that includes a photovoltaic cell and an oscillation circuit or device whose function is to cause a signal generated by the photovoltaic cell to oscillate in a negative differential resistance range, thereby directly producing an AC output voltage and/or electromagnetic radiation. The components of the oscillation circuit or device are distinguished from components of a power inverter at least in that the oscillator circuit components are directly connected to the photovoltaic cell in a manner that causes, e.g., the output current of the photovoltaic cell to oscillate (i.e., the signal on at least one terminal of the photovoltaic cell continuously varies with time) in response to a constant solar flux amount. In contrast, the components of a power inverter are remotely coupled "downstream" to the photovoltaic cell such that a signal generated on the terminals of the photovoltaic cell remains relatively constant in response to a constant solar flux amount. In addition, in accordance with the present invention, the negative resistance of the solar cell is utilized to maintain the oscillation. This is different from conventional approaches (e.g., oscillators powered by conventional a solar cell) where the solar cell provides the energy for the circuitry, but not the negative resistance, which is provided by some other part of the circuitry. In other words, the oscillation in a conventional circuit or power inverter may cause a varying solar-cell current or voltage, but that variation does not occur in a range of negative resistance, and is not maintained by that negative resistance. Accordingly, as used herein, the term "connected" is used to indicate direct connection between a photovoltaic cell and an oscillation circuit component (i.e., by way of a wire or resistive element), and the term "coupled" is used to indicate indirect connection between two components (e.g., by way of capacitor or transformer).

Figure 1:
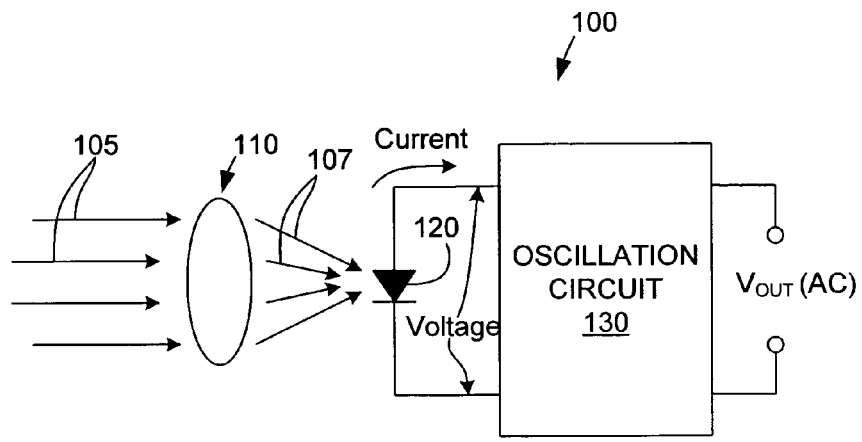
FIG. 1 is a simplified diagram showing an AC solar power apparatus according to a generalized embodiment of the present invention.

FIG. 1 is a simplified diagram showing an AC solar power apparatus 100 according to a generalized exemplary embodiment of the present invention. AC solar power apparatus includes an optional focusing apparatus 110, a photovoltaic cell 120, and a resonator 130 connected to the anode and cathode of photovoltaic cell 120.

Focusing apparatus 110 serves to concentrate parallel sunlight beams 105 in order to generate high solar flux 107 that is directed onto photovoltaic cell 120. Recently it has been demonstrated that at least some solar cells receiving high solar flux, (e.g., in the range of 100 to 10,000 suns) exhibit hysteretic IV curves that include a range of negative resistance. The purpose of focusing apparatus 110 is to generate high solar flux 107 such that power output from photovoltaic cell 120 is within this negative differential resistance range. As such, focusing apparatus 110 may include an automatic adjustment or trimming mechanism that adjusts to produce high solar flux 107 in the desired range. Note that although focusing apparatus is depicted as a lens, other mechanisms such as curved mirrors may be utilized to produce the required concentration.

Figure 2A:
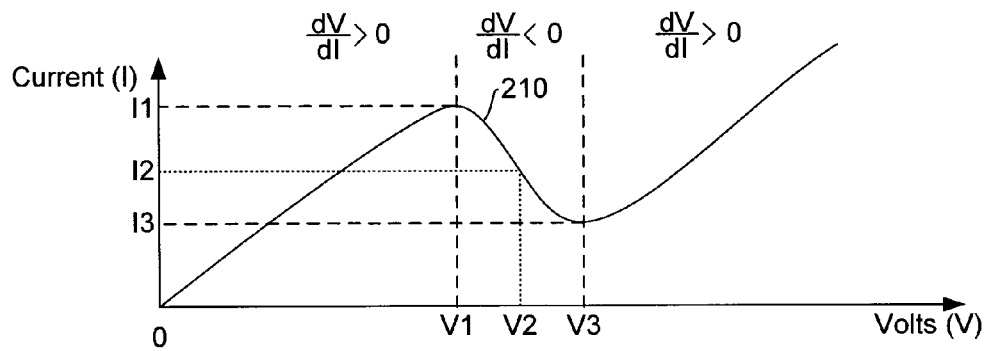
FIG. 2(A) is a graph showing an IV curve generated by a photodiode in response to an applied light irradiance.

Photovoltaic cell 120 is, for example, a multi-junction solar cell employing tunnel junctions to combine the currents from the sub cells. Such photovoltaic cells 120 have demonstrated output voltage-current (V-I) characteristics similar to those depicted by line 210 in FIG. 2(A). Specifically, at low voltages (i.e., 0 to V1), output current I (as depicted by the leftmost segment of line 210) exhibits a positive differential resistance, wherein output current is directly proportional to an amount of said applied light irradiation, and an increase in output voltage produces an associated increase in output current ((dV/dI)>0). Similarly, at very high voltage levels (i.e., above V3), output current I (as indicated by the rightmost segment of line 210) exhibits a similar positive differential resistance. According to recent demonstrations, photovoltaic cell 120 exhibits a range of differential resistance between these two extremes (e.g., in the range between voltages V1 and V3 in FIG. 2(A)) wherein an incremental increase in the output voltage produces an associated decrease in a generated current ((dV/dI)<0). For example, photodiode generates an output power having a voltage V1 and a relatively high current I1 in response to an associated solar flux. As the voltage is increased from this point, for example, to voltage V2, the output current generated by photodiode 120 decreases to current I2. Further increase in the solar flux causes the output voltage to further increase to an upper end of the negative differential voltage range (voltage V3), where the output current reaches a local minimum I3. In one example, a triple junction photovoltaic cell 120 exhibits a negative differential resistance range centered at approximately 3 Volts (i.e., V2 approximately equals 3 Volts), and has a range of 1 Volt (e.g., 2.5 Volts to 3.5 Volts). In the following discussion and appended claims, the phrase "negative differential resistance range" is used to describe the output power range of a photovoltaic cell where an increasing output voltage produces a decreasing output current (e.g., between voltages V1 and V2; (FIG. 2(A)).

Figure 2B:
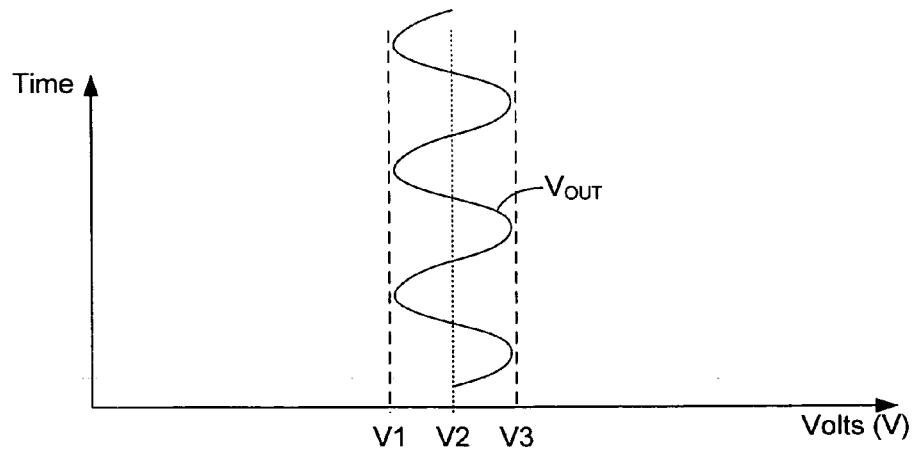
FIG. 2(B) is a graph showing an output voltage generated by the AC solar power apparatus of FIG. 1.

In accordance with the present invention, AC solar power apparatus 100 utilizes an oscillation circuit 130 that causes output voltage $V_{OUT}$ generated by photovoltaic cell 120 in response to high irradiance to oscillate within the negative differential resistance range (e.g., in the range of V1 to V3, as indicated in FIG. 2(B)), thus producing AC power. Similar circuits are produced for tunnel (aka Esaki or Gunn) diodes, which also exhibit an I-V curve with a range of negative differential resistance, but in which case the circuit energy is provided externally and not by the tunnel diode, as is well known in the art (see, for example, B. van der Pol, A theory of the amplitude of free and forced triode vibrations, Radio Review, 1 (1920), pp. 701–710, 754–762; see also B. van der Pol, On "Relaxation Oscillations" I, Phil. Mag., 2 (1926), pp. 978–992). When connected to a suitable resonator circuit (LC, transmission line or cavity) and subjected to an appropriate critical solar flux (e.g., 3760 suns), the negative resistance associated with the negative differential resistance range compensates for resonator losses and loads, thereby maintaining oscillation. As indicated in FIG. 2(B), resistance is most negative for small signals centered in the negative differential resistance range. Note that the average resistance increases (i.e. becomes less negative) with increasing signal amplitude to become positive at V3. This effect makes oscillation a self limiting process. Oscillation will start if the net resonator resistance is negative and signal amplitude will continue to grow until its average is zero.

In accordance with another aspect of the present invention, a power module includes multiple solar power apparatus 100 (described above) that are integrated using known techniques such that the collective AC power generated by the multiple apparatus produces a desired power level. Synchronizing the oscillatory frequencies and phases of multiple photovoltaic cells should enable the combination of AC power from an array of such cells.

Figure 3:
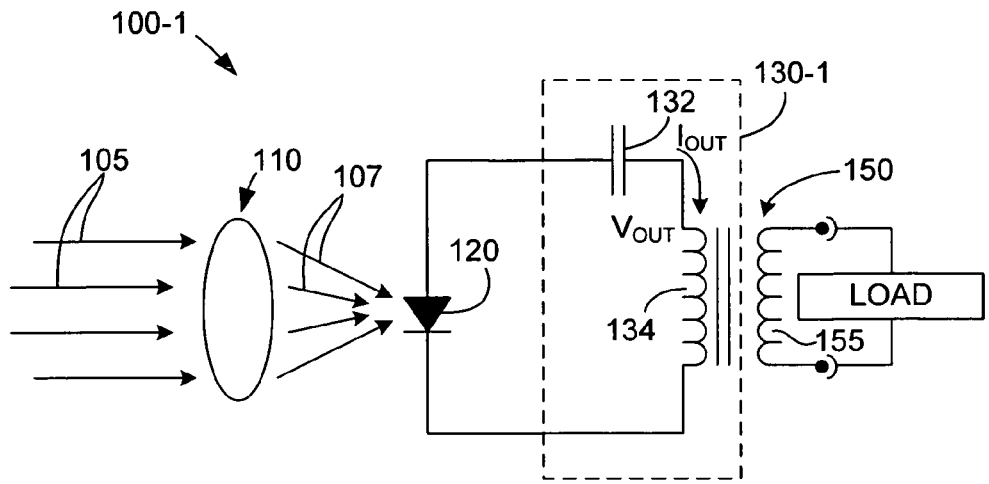
FIG. 3 is a simplified diagram showing an AC solar power apparatus according to an exemplary embodiment of the present invention.
Figure 4:
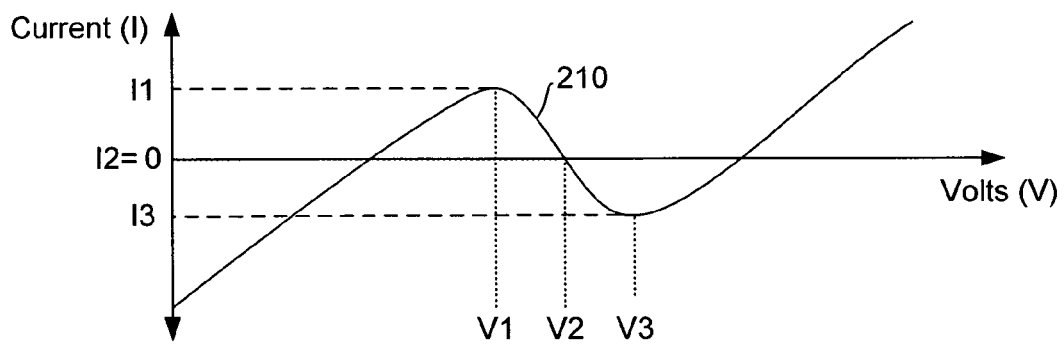
FIG. 4 is a graph showing an IV curve generated by a photodiode of an AC solar power apparatus according to another exemplary embodiment of the present invention.

FIGS. 3 and 4 are a simplified circuit diagram and associated I-V graph showing an AC solar power apparatus 100-1 according to a specific exemplary embodiment of the present invention. Solar power apparatus 100-1 includes focusing apparatus 110 and photovoltaic cell 120 (both described above), and also includes an oscillation circuit 130-1 made up of passive components that produce the desired oscillation. In this exemplary embodiment, oscillation circuit 130-1 includes an LC circuit made up of a capacitor 132 connected to the anode of photovoltaic cell 120, and an inductor 134 that is connected between capacitor 132 and the cathode of photovoltaic cell 120. In this specific case the range of negative resistance is situated around an operation point (V2, I2) with zero DC current I2, and capacitor 132 blocks DC current. The inventors believe that solar power apparatus 100-1 could generate AC power that can be used in a variety of ways. In the illustrated example, a transformer 150 formed by inductor 134 and an external inductor 155 is used to step the output voltage $V_{OUT}$ to a desired (high or lower) voltage level. This desired level could, for example, be a higher voltage than can be generated on a panel including solar power apparatus 100-1. In this case, the transformer leakage inductance resonates against the tank capacitor. If very high frequencies are generated, transmission line structures can be used to carry power away from the photovoltaic cells. It is also possible to match the frequency and phase to an external electrical grid, and feed power to the external grid directly.

Figure 5:
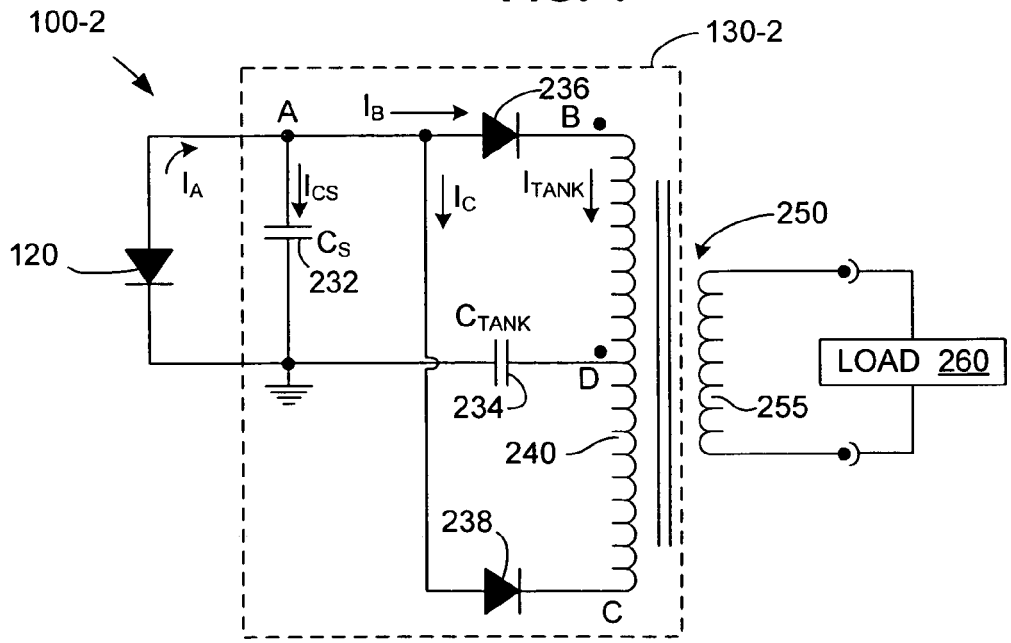
FIG. 5 is a simplified diagram showing an AC solar power apparatus according to another exemplary embodiment of the present invention.
Figure 6A:
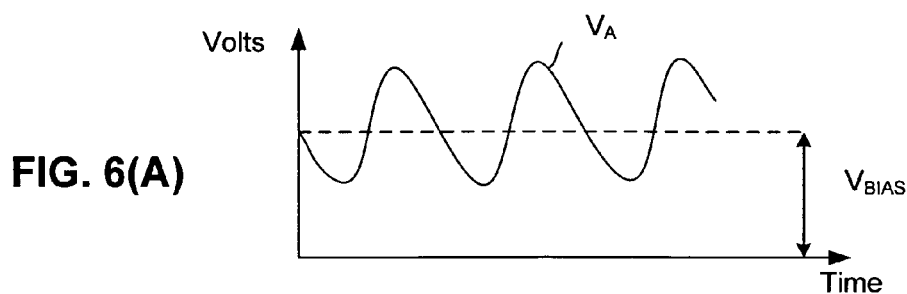
FIGS. 6(A), 6(B), and 6(C) are graphs depicting various internal signals generated in the AC solar power apparatus of FIG. 5.
Figure 6B:
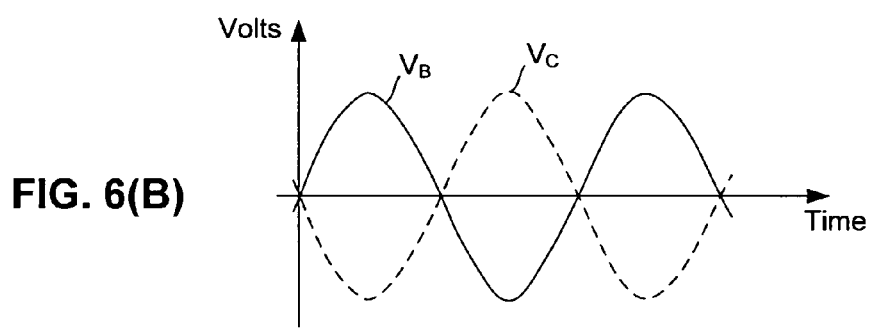
Figure 6C:
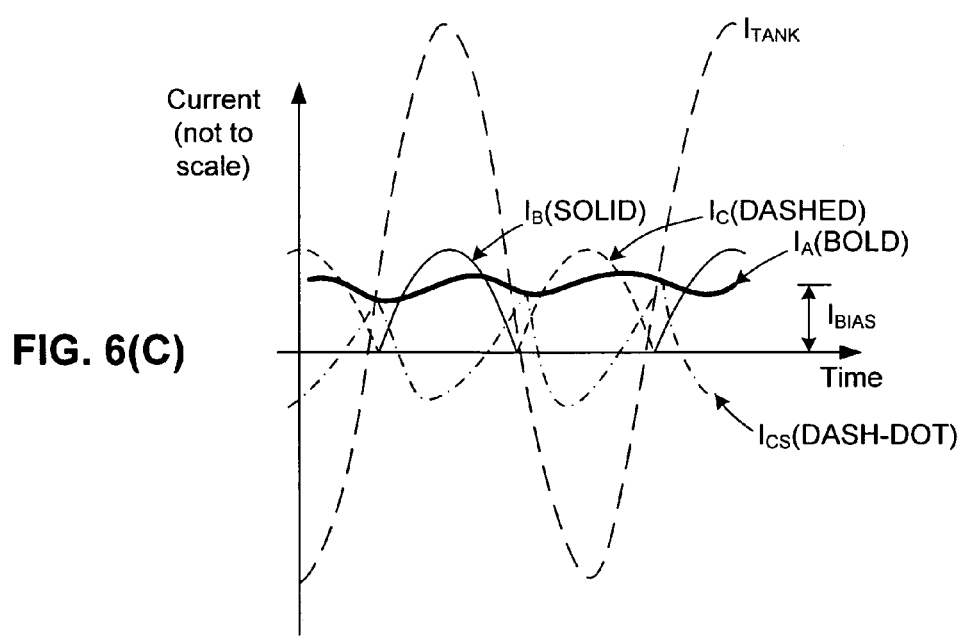

FIG. 5 is a simplified circuit diagram showing an AC solar power apparatus 100-2 according to another specific exemplary embodiment, wherein a rectifier converts the DC bias current into a useful AC current that is passed by a transformer to an external load. FIGS. 6(A), 6(B), and 6(C) are graphs depicting various internal signals (voltages and currents) generated in AC solar power apparatus 100-2.

Referring to FIG. 5, oscillation circuit 130-2 of apparatus 100-2 includes a storage capacitor 232 having a capacitance $C_S$ that is connected in parallel to a photovoltaic cell 120, a tank capacitor 234 having a capacitance $C_{TANK}$ connected to the cathode of photovoltaic cell 120, a first diode 236 and a second diode 238 connected to the anode of photovoltaic cell 120, and an inductor 240. A first node A of oscillation circuit 130-2 is defined between the anodes of photovoltaic cell 120 and first diode 236, which is connected to a positive (non-grounded) side of storage capacitor 232. The cathode of first diode 236 is connected to a second node B defined at a first end terminal of inductor 240, and the cathode of second diode 238 is connected to a third node C defined at a second end terminal of inductor 240. Tank capacitor 234 is connected to a central (fourth) node D that is connected to a central terminal of inductor 240 (i.e., between the first and second end terminals). In the present embodiment, inductor 240 makes up one side of a transformer 250, which includes external inductor 255 that couples apparatus 100-2 to an external load 260.

In operation, a light concentrating mechanism (e.g., focusing apparatus 110, described above) is utilized to concentrate radiant (e.g., solar) energy onto photovoltaic cell 120 at a sufficient level to cause photovoltaic cell 120 to generate output power in its negative differential resistance range. In response to the applied radiant energy and under the influence of oscillation circuit 130-2, photovoltaic cell 120 generates an AC voltage $V_A$ (see FIG. 6(A)) and an AC current $I_A$ (see FIG. 6(C)) at node A (note that each of the voltage and the current have a DC component). The DC component of current $I_A$ ($I_{BIAS}$, shown in FIG. 6(C)), which is generated by photovoltaic cell 120, is switched back and forth between two halves of the resonator tank formed by inductor 240 and tank capacitor 234 using diodes 236 and 238 as rectifiers, while DC storage capacitor 232 maintains a DC voltage component $V_{BIAS}$ (shown in FIG. 6(A)) across photovoltaic cell 120. DC storage capacitor 232 is chosen such that its variations in its current $I_{CS}$ create a voltage ripple that tracks the negative differential resistance range of the apparatus' I-V curve. The resulting voltages $V_B$ and $V_C$ at nodes B and C, respectively, are depicted in FIG. 6(B), and currents $I_B$ and $I_C$ as depicted in FIG. 6(C). As such, photovoltaic cell 120 represents an equivalent negative AC resistance to the resonator tank, thereby producing the high amplitude tank current $I_{TANK}$ shown in FIG. 6(C). Note that, in FIGS. 6(A) to 6(C), the current and voltage plots assume a zero diode bias for clarity.

It is noted how current $I_A$ of photovoltaic cell 120 has an AC component that is synchronized with the tank current $I_{TANK}$. This is what sustains the oscillating signal in the tank resonator. Note also how the tank capacitor 234 keeps the DC bias off the tank transformer.

In one embodiment, the rectifiers (i.e., diodes 236 and 238) utilized in apparatus 100-2 of FIG. 5 have a typical dropout of 0.7V for a silicon or 0.3V for a Schottky diode. This is almost as much as the negative resistance range in the solar cell I-V curve. Active rectifiers like MOSFETs can be used instead for very low dropout. For example, diodes 236 and 238 may be replaced by n-type MOSFETs, with the gate of upper MOSFET driven using node C voltage $V_C$, and the gate of the bottom MOSFET driven using node B voltage $V_B$.

In one embodiment, the power output by apparatus 100 is "dumped" into an external power grid. It is noted that the required oscillation frequency of 60 Hz (USA, Japan) or 50 Hz (Europe) is very low, thus requiring an oscillation circuit made up of very large tank capacitors and inductors. In accordance with an alternative embodiment, the tank capacitor is moved to the secondary circuit of the output transformer (i.e., between inductor 255 and load 260 in apparatus 100-2; FIG. 5) to create a higher effective capacitance.

The production of AC solar panels incorporating the solar power apparatus described herein could be done without the introduction of new materials by simply adding the necessary circuit elements to put the cells into oscillation and to process the power therefrom. The present inventors are currently contemplating the assembly of solar modules using pick and place equipment, the addition of other components to complete the oscillator function could be done at little additional cost to the overall architecture. More advanced AC solar cells could include integrated passives and other elements to more fully integrate the function monolithically, but this is not essential to this invention.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. An alternating current solar power apparatus comprising:
   a photovoltaic cell for generating output power in response to an applied light irradiation such that an output voltage of the generated output power is determined by an amount of said applied light irradiation, wherein said photovoltaic cell exhibits negative differential resistance when said output voltage is within a negative differential resistance range in response to an associated amount of said applied light irradiation, whereby an incremental increase in the output voltage within the negative differential resistance range produces an associated decrease in a generated current of said generated electrical signal; and
   an oscillation circuit connected to the photovoltaic cell for causing the output voltage to oscillate within the negative differential resistance range such that the output power comprises an alternating current.

2. The alternating current solar power apparatus according to claim 1, wherein the applied light irradiation comprises sunlight, and wherein the alternating current solar power apparatus further comprising means for concentrating said sunlight such that solar flux applied to said photovoltaic cell is in the range of 100 to 10,000 suns.

3. The alternating current solar power apparatus according to claim 1, wherein said oscillating means comprises passive components including at least one of a capacitor and an inductor that is directly connected to at least one terminal of the photovoltaic cell.

4. The alternating current solar power apparatus according to claim 3, wherein said passive components comprise a capacitor and an inductor connected in series with the photovoltaic cell.

5. The alternating current solar power apparatus according to claim 1, wherein said passive components comprise:
   a storage capacitor connected in parallel with the photovoltaic cell;
   a tank capacitor having a first terminal connected to a first terminal of the storage capacitor and to a first terminal of the photovoltaic cell;
   first and second diodes, each of the first and second diodes having an anode connected to a second terminal of the storage capacitor and to a second terminal of the photovoltaic cell; and
   an inductor having a first end terminal connected to the cathode of the first diode, a second end terminal connected to the cathode of the second diode, and a central terminal connected to a second terminal of the tank capacitor.

6. The alternating current solar power apparatus according to claim 1, further comprising means for stepping the output voltage to a desired voltage level.

7. The alternating current solar power apparatus according to claim 1, wherein the negative differential resistance range of the photovoltaic cell is further characterized as being centered at zero DC current.

8. An alternating current solar power apparatus comprising:
   a photovoltaic cell for generating output power in response to an applied light irradiation such that an output voltage of the generated output power is determined by an amount of said applied light irradiation, wherein said photovoltaic cell exhibits negative differential resistance when said output voltage is within a negative differential resistance range in response to an associated amount of said applied light irradiation, whereby an incremental increase in the output voltage within the negative differential resistance range produces an associated decrease in a generated current of said generated electrical signal;
   means for transmitting sufficient light irradiation such that the output voltage of the photovoltaic cell is in the negative differential resistance range; and
   means for causing the output voltage to oscillate within the negative differential resistance range such that the output power comprises an alternating current.

* * * * *